US006919770B2

(12) United States Patent
Happer et al.

(10) Patent No.: US 6,919,770 B2
(45) Date of Patent: Jul. 19, 2005

(54) METHOD AND SYSTEM FOR OPERATING AN ATOMIC CLOCK WITH REDUCED SPIN-EXCHANGE BROADENING OF ATOMIC CLOCK RESONANCES

(75) Inventors: William Happer, Princeton, NJ (US); Daniel K. Walter, Falls Church, VA (US)

(73) Assignee: Princeton University, Princeton, NJ (US)

( * ) Notice: Subject to any disclaimer, the term of this patent is extended or adjusted under 35 U.S.C. 154(b) by 105 days.

(21) Appl. No.: 10/620,159

(22) Filed: Jul. 15, 2003

(65) Prior Publication Data

US 2004/0233003 A1 Nov. 25, 2004

Related U.S. Application Data

(60) Provisional application No. 60/453,839, filed on Mar. 11, 2003.

(51) Int. Cl.[7] .................................................. H03L 7/26

(52) U.S. Cl. .................................. 331/94; 331/1; 331/3

(58) Field of Search ................ 331/94.1, 3; 372/69–73, 372/32; 368/10

(56) References Cited

U.S. PATENT DOCUMENTS

| | | | | |
|---|---|---|---|---|
| 4,122,408 A | | 10/1978 | Walls | 331/3 |
| 4,425,653 A | | 1/1984 | Cutler | 372/70 |
| 4,476,445 A | | 10/1984 | Riley, Jr. | 331/3 |
| 4,943,955 A | | 7/1990 | Rabian et al. | 368/156 |
| 5,146,184 A | | 9/1992 | Cutler | 331/3 |
| 5,148,437 A | * | 9/1992 | Ohtsu | 372/32 |
| 5,192,921 A | * | 3/1993 | Chantry et al. | 331/3 |
| 5,327,105 A | * | 7/1994 | Liberman et al. | 331/94.1 |

(Continued)

OTHER PUBLICATIONS

Bell, William E., Bloom, Arnold L., optical Detection of Magnetic Resonance in Alkali Metal Vapor, Phys. Rev. 107, 1559–1556, Issue 6, Sep. 1957.

Walter, D.K., Griffith, W.M. and Happer, W., Magnetic Slowing Down of Spin Relaxation due to Binary Collisions of Alkali–Metal Atoms with Buffer–Gas Atoms, Phys. Rev. Lett. 88, 093004 (2002).

Ressler, N.W., Sands, R.H., Stark, T.E., Measurement of Spin–Exchange Cross Sections for Cs133, Rb87, Rb85, K39, and Na23, Phys. Rev. 184, 102–118, Issue 1, Aug. 1969.

Anderson, L.W and Baird, James C., N14–N15 Hyperfine Anomaly, Phys. Rev. 116, 87–98, Issue 1, Oct. 1959.

Srinivasa, K. and Rajeswari, V., Quantum Theory of Angular Momentum: Selected Topics, Published by Springer–Verlag and Narosa Publishing House (1993).

Appelt, S, Ben–Amar Baranga, Young, A. R., Happer, W., Light narrowing of rubidium magnetic–resonance lines in high–pressure optical–pumping cells, Physical Review A, vol. 59, No. 3, pp. 2078–2084.

*Primary Examiner*—Robert Pascal
*Assistant Examiner*—Joseph Chang
(74) *Attorney, Agent, or Firm*—Mathews, Collins, Shepherd & McKay, P.A.

(57) ABSTRACT

The present invention relates to a method and system for using end resonances of highly spin-polarized alkali metal vapors for an atomic clock, magnetometer or other system. A left end resonance involves a transition from the quantum state of minimum spin angular momentum along the direction of the magnetic field. A right end resonance involves a transition from the quantum state of maximum spin angular momentum along the direction of the magnetic field. For each quantum state of extreme spin there are two end resonances, a microwave resonance and a Zeeman resonance. The microwave resonance is especially useful for atomic clocks, but it can also be used in magnetometers. The low frequency Zeeman resonance is useful for magnetometers.

32 Claims, 6 Drawing Sheets

U.S. PATENT DOCUMENTS

| | | | | |
|---|---|---|---|---|
| 5,379,000 | A | 1/1995 | Brewer et al. | 331/3 |
| 5,606,291 | A | 2/1997 | Verbanets | 331/3 |
| 5,642,625 | A | 7/1997 | Cates, Jr. et al. | 62/55.5 |
| 5,657,340 | A | 8/1997 | Camparo et al. | 372/69 |
| 5,852,386 | A | 12/1998 | Chantry et al. | 331/94.1 |
| 6,025,755 | A | 2/2000 | Camparo | 331/3 |
| 6,157,261 | A | 12/2000 | Audoin et al. | 331/3 |
| 6,303,928 | B1 | 10/2001 | Buell et al. | 250/251 |
| 6,426,679 | B1 | 7/2002 | Oblak et al. | 331/3 |
| 6,518,092 | B2 | 2/2003 | Kikuchi | 438/107 |
| 2004/0202050 | A1 * | 10/2004 | Happer et al. | 368/10 |

* cited by examiner

METHOD AND SYSTEM FOR OPERATING AN ATOMIC CLOCK WITH REDUCED SPIN-EXCHANGE BROADENING OF ATOMIC CLOCK RESONANCES

CROSS REFERENCE TO RELATED APPLICATION

This application claims priority to U.S. Provisional Application No. 60/453,839, filed on Mar. 11, 2003, the disclosure of which is hereby incorporated by reference in its entirety.

BACKGROUND OF THE INVENTION

1. Field of the Invention

The present invention relates to the field of optically pumped atomic clocks or magnetometers, and more particularly to atomic clocks or magnetomers operating with novel end resonances, which have much less spin-exchange broadening and much larger signal-to-noise ratios than those of conventional resonances.

2. Description of the Related Art

Conventional, gas-cell atomic clocks utilize optically pumped alkali-metal vapors. Atomic clocks are utilized in various systems which require extremely accurate frequency measurements. For example, atomic clocks are used in GPS (global position system) satellites and other navigation and positioning systems, as well as in cellular phone systems, scientific experiments and military applications.

In one type of atomic clock, a cell containing an active medium, such as rubidium or cesium vapor, is irradiated with both optical and microwave power. The cell contains a few droplets of alkali metal and an inert buffer gas at a fraction of an atmosphere of pressure. Light from the optical source pumps the atoms of the alkali-metal vapor from a ground state to an optically excited state, from which the atoms fall back to the ground state, either by emission of fluorescent light or by quenching collisions with a buffer gas molecule like $N_2$. The wavelength and polarization of the light are chosen to ensure that some ground state sublevels are selectively depopulated, and other sublevels are overpopulated compared to the normal, nearly uniform distribution of atoms between the sublevels. It is also possible to excite the same resonances by modulating the light at the Bohr frequency of the resonance, as first pointed out by Bell and Bloom, W. E. Bell and A. L. Bloom, Phys. Rev. 107, 1559 (1957), hereby incorporated by reference into this application. The redistribution of atoms between the ground-state sublevels changes the transparency of the vapor so a different amount of light passes through the vapor to a photodetector that measures the transmission of the pumping beam, or to photodetectors that measure fluorescent light scattered out of the beam. If an oscillating magnetic field with a frequency equal to one of the Bohr frequencies of the atoms is applied to the vapor, the population imbalances between the ground-state sublevels are eliminated and the transparency of the vapor returns to its unpumped value. The changes in the transparency of the vapor are used to lock a clock or magnetometer to the Bohr frequencies of the alkali-metal atoms.

The Bohr frequency of a gas cell atomic clock is the frequency v with which the electron spin precesses about the nuclear spin I for an alkali-metal atom in its ground state. The precession is caused by the magnetic hyperfine interaction. Approximate clock frequencies are v=6.835 GHz for $^{87}$Rb and v=9.193 GHz for $^{133}$Cs. Conventionally, clocks have used the "0-0" resonance which is the transition between an upper energy level with azimuthal quantum number 0 and total angular momentum quantum number f=I+½, and a lower energy level, also with azimuthal quantum number 0 but with total angular momentum quantum number f=I−½.

For atomic clocks, it is important to have the minimum uncertainty, δν, in the resonance frequency ν. The frequency uncertainty is approximately given by the ratio of the resonance linewidth, Δν, to the signal to noise ratio, SNR, of the resonance line. That is, δν=Δν/SNR. Clearly, one would like to use resonances with the smallest possible linewidths, Δν, and the largest possible signal to noise ratio, SNR.

For miniature atomic clocks it is necessary to increase the density of the alkali-metal vapor to compensate for the smaller physical path length through the vapor. The increased vapor density leads to more rapid collisions between alkali-metal atoms. These collisions are a potent source of resonance line broadening. While an alkali-metal atom can collide millions of times with a buffer-gas molecule, like nitrogen or argon, with no perturbation of the resonance, every collision between pairs of alkali-metal atoms interrupts the resonance and broadens the resonance linewidth. The collision mechanism is "spin exchange," the exchange of electron spins between pairs of alkali-metal atoms during a collision. The spin-exchange broadening puts fundamental limits on how small such clocks can be. Smaller clocks require larger vapor densities to ensure that the pumping light is absorbed in a shorter path length. The higher atomic density leads to larger spin-exchange broadening of the resonance lines, and makes the lines less suitable for locking a clock frequency or a magnetometer frequency.

It is desirable to provide a method and system for reducing spin-exchange broadening in order to make it possible to operate atomic clocks at much higher densities of alkali-metal atoms than conventional systems.

SUMMARY OF THE INVENTION

The present invention relates to a method and system for using end resonances of highly spin-polarized alkali metal vapors for an atomic clock, magnetometer or other system. A left end resonance involves a transition from the quantum state of minimum spin angular momentum along the direction of the magnetic field. A right end resonance involves a transition from the quantum state of maximum spin angular momentum along the direction of the magnetic field. For each quantum state of extreme spin there are two end resonances, a microwave resonance and a Zeeman resonance. For $^{87}$Rb, the microwave end resonance occurs at a frequency of approximately 6.8 GHz and for $^{133}$CS the microwave end resonance frequency is approximately 9.2 GHz. The Zeeman end resonance frequency is very nearly proportional to the magnetic field. For $^{87}$Rb the Zeeman end resonance frequency is approximately 700 KHz/G, and for $^{133}$Cs the Zeeman end resonance frequency is approximately 350 KHz/G. The microwave resonance is especially useful for atomic clocks, but it can also be used in magnetometers. The low frequency Zeeman resonance is useful for magnetometers.

Unlike most spin-relaxation mechanisms, spin-exchange collisions between pairs of alkali metal atoms conserve the total spin angular momentum (electronic plus nuclear) of the atoms. This causes the spin-exchange broadening of the end resonance lines to approach zero as the spin polarization P of the vapor approaches its maximum or minimum values, P=±1. Spin-exchange collisions efficiently destroy the coherence of 0-0 transition, which has been universally used in atomic clocks in the past. As an added benefit, end resonances can have much higher signal-to-noise ratios than the conventional 00 resonance. The high signal-to-noise ratio occurs because it is possible to optically pump nearly 100% of the alkali-metal atoms into the sublevels of maximum or minimum angular momentum. In contrast, a very small fraction, typically between 1% and 10% of the atoms, participate in the 00 resonance, since there is no simple way to concentrate all of the atoms into either of the states between which the 00 resonance occurs. The same high angular momentum of the quantum states involved in the end resonances accounts for their relative freedom from resonance line broadening. Spin-exchange collisions between pairs of alkali-metal atoms, which dominate the line broadening for the dense alkali-metal vapors needed for miniature, chip-scale atomic clocks, conserve the spin angular momentum. Since the states for the end transition have the maximum possible angular momentum, spin-exchange collisions cannot remove the atoms from their initial state, because all different final states have lower values of the spin angular momentum. None of these advantages accrue to the quantum states of the conventional 0-0 transition.

The invention will be more fully described by reference to the following drawings.

DETAILED DESCRIPTION

Figure 1:
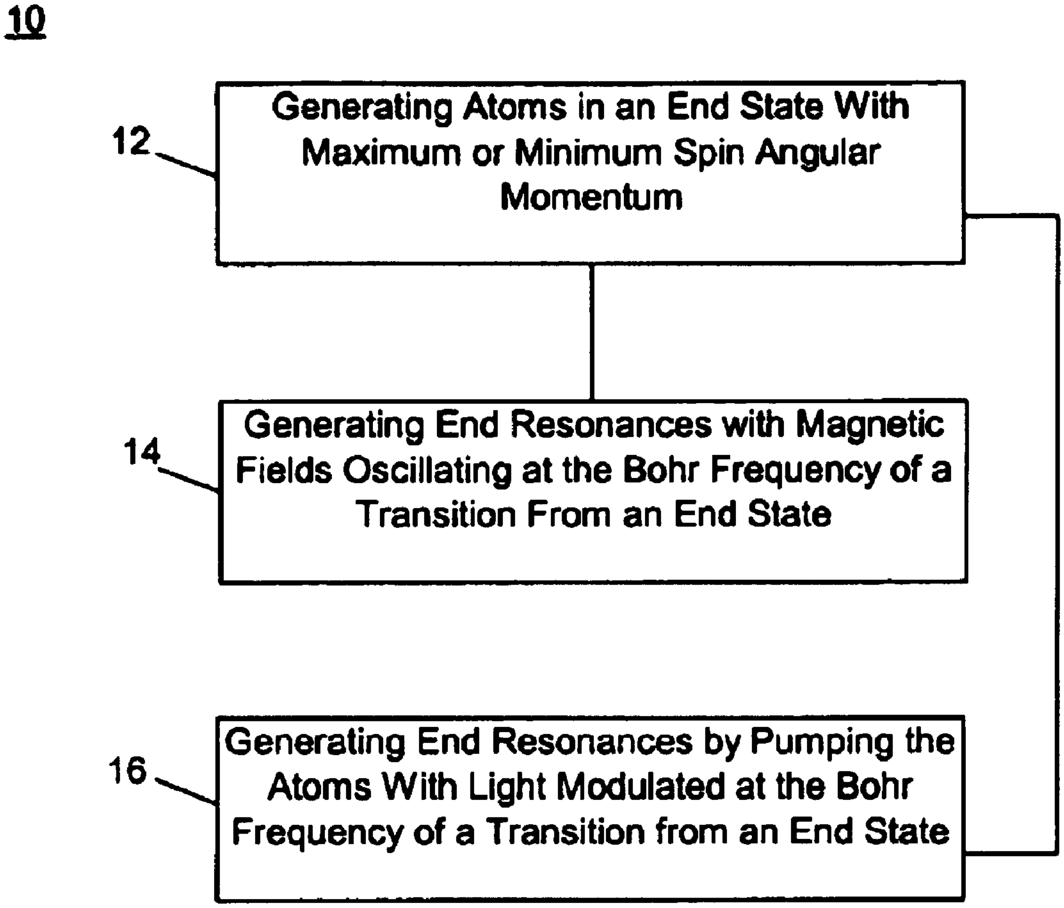
FIG. 1 is a flow diagram of a method of operating an atomic clock in accordance with the teachings of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a flow diagram of a method of operating an atomic clock 10 in accordance with the teachings of the present invention. In block 12, atoms are generated in an initial state having maximum or minimum spin angular momentum. The quantum numbers f and m are used to label the ground-state sublevels of the alkali-metal atom. Here f is the quantum number of the total spin, electronic plus nuclear, of the atom, and m, is the azimuthal quantum number, the projection of the total spin along the direction of the magnetic field. The possible values of f are f=I+½=a or f=I−½=b, and the possible values of m are m=f, f−1, f−2, . . . , −f For example, for a left end resonance, the initial state i, of minimum spin angular momentum has the quantum numbers, $f_i$, $m_i$=$a_i$−a. For a microwave end resonance, the corresponding final state j will have the quantum numbers $f_j$, $m_j$=b, −b. Most of the atoms can be placed in the initial state by pumping the vapor with circularly polarized light for which the photon spins have one unit of angular momentum antiparallel to the direction of the magnetic field. The Bohr frequency of the left end resonance is ω−. For example, the end resonance can be a right end resonance. The right end resonance transition is defined as a transition that occurs between the states $f_i$, $m_i$=a, a and $f_j$, $m_j$=b, b with the Bohr frequency of ω+. Most of the atoms can be placed in the initial state by pumping the vapor with circularly polarized light for which the photon spins have one unit of angular momentum parallel to the direction of the magnetic field.

In block 14, atoms are generated in a second state having an end resonance by magnetic fields oscillating at the Bohr frequency of a transition from an end state. The magnetic field can oscillate at the Bohr frequency ω− or ω+ of the resonance. The atoms can be rubidium atoms or cesium atoms. The atoms can be pumped with circularly polarized, D1 resonance light for the rubidium or cesium atoms. Alternatively, in block 16, atoms are generated with end resonances by pumping the atoms with light modulated at the Bohr frequency of a transition from an end state. The light is modulated at the Bohr frequency ω− or ω+ of the resonance. The atoms can be rubidium atoms or cesium atoms. The atoms can be pumped with modulated, circularly polarized, D1 resonance light for the Rb or Cs atoms.

A similar method described above for operating an atomic clock can be used for operating a magnetometer.

Hyperfine transitions of the atoms having a first end resonance and second end resonance are generated by applying radiation at the first transition frequency and the second transition frequency. The first transition frequency can be a high frequency resonance that is about 6.8 GHz for $^{87}$Rb and 9.2 GHz for $^{133}$CS. A similar method can be used for operating a magnetometer in which a low frequency Zeeman resonance is used with a right end resonance and a left end resonance.

Relaxation due to spin exchange can be analyzed by letting the time evolution of the spins be due to the combined effects of binary spin-exchange collisions, as first described by Grossetête, F., 1964, *J. Phys.* (Paris), 25, 383; 1968, *J. Phys.* (Paris), 29, 456; Appelt, S. et al., 1998, *Phys. Rev. A,* 58, 1412 and free evolution in the intervals between collisions. Then the rate of change of the density matrix p is given by the non-linear equation, as described in Gibbs, H. M. and Hull, R. J., 1967, *Phys. Rev.,* 153, 132

$$T_{ex}\frac{d\rho}{dt} = \frac{Tex}{i\hbar}[H,\rho] - \frac{3}{4}\phi + S\cdot\rho S + \langle S\rangle\cdot(\{S,\rho\} - 2iS\times\rho S) \quad (1)$$

$T_{ex}$ is the mean time between spin-exchange collisions. For alkali-metal vapors of number density N, the spin exchange rate is $1/T_{ex}=\kappa N$. The rate coefficient $\kappa\approx10^{-9}$ cm$^{-3}$ sec$^{-1}$ is very nearly the same for all alkali elements, and has little dependence on temperature, as described in Ressler, N. W., Sands, R. H., and Stark, T. E., 1969, *Phys. Rev.,* 184, 102; Walter, D. K., Griffith, W. M., and Happer, W., 2002, *Phys. Rev. Lett.,* 88, 093004 and Anderson, L. W., Pipkin, F. M., and Baird, J. C., 1959, *Phys. Rev.,* 116, 87, hereby incorporated by reference into this application.

The Hamiltonian H of equation (1) is $$H = AI\cdot S + g_S\mu_B BS_z - \frac{\mu_I}{I}BI_z. \quad (2)$$

A is the coefficient for the magnetic dipole coupling of the nuclear spin I to the electron spin S. For example, in $^{87}$Rb, A/h=3417.3 MHz. The spins are also coupled to an externally applied magnetic field of magnitude B, directed along the z-axis of a coordinate system. The Bohr magneton is $\mu_B$=9.274x10$^{-24}$ J T$^{-1}$, and the g value of the electron is gs=2.0023. The magnetic moment of the alkali nucleus is $\mu_I$; for example, for the alkali-metal isotope $^{87}$Rb, $\mu_I$=2.75 $\mu_N$, where $\mu_N$=5.051x10−$^{27}$ J T$^{-1}$ is the nuclear magneton.

The eigenstates |i> and energies $E_i$ of free ground state atoms are defined by the Schrödinger equation $$H|i\rangle = E_i|i\rangle. \quad (3)$$

The total azimuthal angular momentum operator $F_z=I_z+S_z$ commutes with H, so the eigenstates of equation (3) can be chosen to be simultaneous eigenstates of $F_z$, $$F_z|i\rangle = m_i|i\rangle. \quad (4)$$

The azimuthal quantum numbers $m_i$ are spaced by unit increments between the maximum and minimum values, ±(I+½). It is assumed that $|B|\propto|A/\mu_B|$, so the square of the total angular momentum F=I+S is also very nearly a good quantum number. Then to good approximation $$F\cdot F|i\rangle = f_i(f_i+1)|i\rangle. \quad (5)$$

The quantum numbers $f_i$ can be $f_i$=I+½=a or $f_i$=I−½=b.

The only non-relaxing solution to equation (1) is the spin-temperature distribution, as described by Anderson, L. W., Pipkin, F. M., and Baird, J. C., 1959, *Phys. Rev.,* 116, 87 and already cited above.

$$\rho^{(0)} = \frac{1}{Z}e^{\beta F_z}. \quad (6)$$

Substituting equation (6) into equation (1) it is verified that $$\frac{d\rho^{(0)}}{dt} = 0. \quad (7)$$

The spin temperature parameter β is related to the spin polarization P by $$P = 2\langle S_z\rangle = \tanh\frac{\beta}{2} \text{ or } \beta = \ln\frac{1+P}{1-P}. \quad (8)$$

The partition function of equation (6) is $$Z=Tr[e^{\beta F_z}]=Z_1 Z_S. \quad (9)$$

For a spin system with spin quantum number J (for example, J=S or J=I) the partition function is $$Z_J = \sum_{m=-J}^{J} e^{\beta m} = \frac{\sinh\beta[J]/2}{\sinh\beta/2} \quad (10)$$

$$= \frac{(1+P)^{[J]} - (1-P)^{[J]}}{2P(1-P^2)^J}. \quad (11)$$

Here and subsequently, a spin quantum number in square brackets denotes the number of possible azimuthal states, for example, [J]=2J+1.

The damping is considered of the coherence $P_{ij}$ between different ground-state sublevels i and j. For example, the coherence can be induced by radiofrequency magnetic fields, tuned to the Bohr frequency $\omega_{ij}=(E_i-E_j)/\hbar$ between the sublevels |i> and |j>, or by pumping light, modulated at the Bohr frequency. Let the polarization state of the atoms be close to the spin temperature limit of equation (6), so that the density matrix can be written as $$\rho=\rho^{(0)}+\rho^{(1)}, \quad (2)$$

where $$\rho^{(1)} = \sum_{rs} |r\rangle\rho_{rs}^{(1)}\langle s|. \quad (13)$$

The expectation value of the electronic spin is $$\langle S\rangle=\langle S\rangle^{(0)}+\langle S\rangle^{(1)}, \quad (14)$$

where $$\langle S\rangle^{(0)} = \frac{P}{2}z, \quad (15)$$

and $$\langle S\rangle^{(1)} = \sum_{rs} \langle s|S|r\rangle\rho_{rs}^{(1)}. \quad (16)$$

Substituting equation (12) and equation (14) into equation (1), assuming no time dependence of β or P, and ignoring terms quadratic $p^{(1)}$, it is found that $$T_{ex}\frac{d\rho^{(1)}}{dt} = \frac{T_{ex}}{i\hbar}[H,\rho^{(1)}] - \frac{3}{4}\rho^{(1)} + S\cdot\rho^{(1)}S + \langle S\rangle^{(1)}\cdot(\{S,\rho^{(0)}\} - 2iS\times\rho^{(0)}S) + \langle S\rangle^{(0)}\cdot(\{S,\rho^{(1)}\} - 2iS\times\rho^{(1)}S). \quad (17)$$

It is noted that $$\{S,\rho^{(0)}\} - 2iS\times\rho^{(0)}S = \frac{e^{\beta I_z}}{Z}V, \quad (18)$$

where $$V=V(\beta)=\{S, e^{\beta S_z}\}-2iS\times e^{\beta S_z}S. \quad (19)$$

Accordingly, it can be verified that $$V(0)=4S, \quad (20)$$

$$\frac{dV}{d\beta}(0) = 0, \quad (21)$$

-continued $$\frac{d^2V}{d\beta^2}=\frac{1}{4}V. \tag{22}$$

The solution of equation (22) subject to the boundary conditions of equation (20) and equation (21) is $$V=4S\cosh\frac{\beta}{2}. \tag{23}$$

Substituting equation (18) and equation (23) into equation (17) and taking the matrix element between the states i and j, it is found that $$\frac{d\rho_{ij}^{(1)}}{dt}=-(\gamma_{ij}+i\omega_{ij})\rho_{ij}^{(1)}-\sum_{rs\neq ij}\Gamma_{ij;rs}\rho_{rs}^{(1)}. \tag{24}$$

The damping rate $\gamma_{ij}=\Gamma_{ij;ij}$, is given by $$T_{ex}\gamma_{ij}=\frac{3}{4}-\langle i|S_z|i\rangle\langle j|S_z|j\rangle-\frac{2}{Z_I}\langle j|S|i\rangle\cdot\langle i|Se^{\beta I_z}|j\rangle-\frac{P}{2}(\langle i|S_z|i\rangle+\langle j|S_z|j\rangle). \tag{25}$$

For the low-field limit, the projection theorem for coupled angular momenta can be used, as described in Appelt, S., Ben-Amar Baranga, Young, A. R., and Happer, W., 1999, *Phys. Rev. A,* 59, 2078 to evaluate matrix elements of $S_z$, and it is found that $$\langle i|S_z|i\rangle\langle j|S_z|j\rangle=\frac{4\bar{m}^2-1}{4[I]^2}, \tag{26}$$

and $$\frac{2}{Z_I}\langle j|S|i\rangle\cdot\langle i|Se^{\beta I_z}|j\rangle=\frac{1}{Z_I}\langle j|S_-|i\rangle\cdot\langle i|S_+e^{\beta I_z}|j\rangle=Q_{\bar{m}}\langle j|S_-|i\rangle\cdot\langle i|S_+|j\rangle. \tag{27}$$

Here $$Q_{\bar{m}}=Q_{\bar{m}}(P)=\frac{e^{\beta\bar{m}}}{Z_I}=\frac{2P(1+P)^{I+\bar{m}}(1-P)^{I-\bar{m}}}{(1+P)^{[I]}-(1-P)^{[I]}} \tag{28}$$

is the probability, as described in Appelt, S., Ben-Amar Baranga, Young, A. R., and Happer, W., 1999, *Phys. Rev. A,* 59, to find the nucleus with the azimuthal number $\bar{m}$ for the spin-temperature distribution of equation (6). The following symmetry is noted $$Q_{\bar{m}}(P)=Q_{-\bar{m}}(-P). \tag{29}$$

Using the projection theorem, as described in Varshalovich, D. A., Moskalev, A. N., and Khersonskii, V. K., 1988, *Quantum Theory of Angular Momentum* (Singapore:World Sci.), hereby incorporated by reference into this application, it is found that $$\langle j|S_-|i\rangle\langle i|S_+|j\rangle=\frac{[f]^2-4\bar{m}^2}{4[I]^2}, \tag{30}$$

-continued and also $$\langle i|S_Z|i\rangle+\langle j|S_Z|j\rangle=\frac{2\bar{m}}{[I]}(-1)^{a-f}. \tag{31}$$

The damping rate is therefore $$T_{ex}\gamma_{f,\bar{m}+1/2;f,\bar{m}-1/2}=\frac{3}{4}-\frac{4\bar{m}^2-1}{4[I]^2}-Q_{\bar{m}}\frac{[f]^2-4\bar{m}^2}{4[I]^2}-\frac{P\bar{m}}{[I]}(-1)^{a-f}. \tag{32}$$

Equation (32) predicts that the spin-exchange damping rate of the Zeeman "end" transition with f=a and $\bar{m}$=I vanishes as P→1.

The damping of resonances with $f_i$=a=I+½, $m_i=\bar{m}$+½ and $f_j$=b=I−½, $m_j=\bar{m}$−½, are excited by magnetic fields, oscillating at right angles to the z axis, and at frequencies on the order of the hyperfine frequency $'hf=[I]A/2h$, ('hf=6834.7 MHz for $^{87}$Rb) or by pumping light modulated at the same frequency. As in the ease of low-field Zeeman resonances described above, it is found that $$\langle i|S_Z|i\rangle\langle j|S_Z|j\rangle=\frac{4\bar{m}^2-1}{4[I]^2}. \tag{33}$$

Equation (27) remains valid for the high-field Zeeman resonances. Using the Wigner-Eckart theorem in the form given by Varshalovich, it is found that $$\langle i|S_+|j\rangle=-\sqrt{\frac{2}{[a]}}\langle a\|S\|b\rangle C_{bm_j;11}^{am_i}. \tag{34}$$

The reduced matrix element is described in Varshalovich, and is $$\langle a\|S\|b\rangle=-\sqrt{\frac{[I]^2-1}{2[I]}}. \tag{35}$$

The Clebsh-Gordon coefficient is given by Table 8.2 of Varshalovich and is $$C_{bm_j;11}^{am_i}=\sqrt{\frac{([I]+2\bar{m})^2-1}{4[I]([I]-1)}}. \tag{36}$$

In analogy to equation (31), it is found $$\langle i|S_Z|i\rangle+\langle j|S_Z|j\rangle=\frac{1}{[I]}. \tag{37}$$

The damping rate is therefore $$T_{ex}\gamma_{a,\bar{m}+1/2;b,\bar{m}-1/2}=\frac{3}{4}+\frac{4\bar{m}^2-1}{4[I]^2}-Q_{\bar{m}}\frac{([I]+2\bar{m})^2-1}{4[I]^2}-\frac{P}{2[I]}. \tag{38}$$

The damping rates for the resonances with $f_i$=a=I+½, $m_i=\bar{m}$−½ $f_i$=b=I −½, $m_j=\bar{m}$+½, can be similarly calculated, and it is found $$T_{ex}\gamma_{a,\overline{m}-1/2;b,\overline{m}+1/2} = \frac{3}{4} + \frac{4\overline{m}^2-1}{4[I]^2} - Q_{\overline{m}}\frac{([I]+2\overline{m})^2-1}{4[I]^2} + \frac{P}{2[I]}. \tag{39}$$

For conventional atomic clocks, unpolarized pumping light with an appropriate frequency profile generates hyperfine polarization (I·S), and the clock is locked to the frequency of the "field-independent 0-0" transition between the states $f_i$, $m_i$=a, 0 and $f_j$, $m_j$=b, 0. The density matrix for the alkali-metal atoms in a conventional atomic clock can therefore be described by equation (12) but with ) $\rho^{(0)}$ given by $$\rho^{(0)} = \frac{1}{2[I]} + \frac{2\langle I\cdot S\rangle I\cdot S}{I(I+1)(2I+1)}. \tag{40}$$

Unlike the spin-temperature distribution of equation (6), which is unaffected by spin-exchange collisions, the hyperfine polarization of equation (40) relaxes at the spin exchange rate; that is, if equation (40) is substituted into equation (1) it is found that $$\frac{d\langle I\cdot S\rangle}{dt} = -\frac{1}{T_{ex}}\langle I\cdot S\rangle. \tag{41}$$

Substituting equation (12) with equation (40) into equation (1), and writing only the self-coupling term explicitly, it is found that in analogy to equation (24)

$$\frac{d\rho^{(1)}_{am:bm}}{dt} = -(\gamma_{am:bm} + i\omega_{am:bm})\rho^{(1)}_{am:bm} - \dots\ . \tag{42}$$

The damping rate $\gamma_{am;\ bm}$ is independent of the hyperfine polarization(I·S), and is given by $$T_{ex}\gamma_{am:bm} = \frac{3}{4} - \langle am|S_z|am\rangle\langle bm|S_z|bm\rangle - \frac{2}{[I]}\langle bm|S_z|am\rangle\langle am|S_z|bm\rangle, \tag{43}$$

which yields $$\gamma_{am:bm} = \frac{1}{T_{ex}}\left[\frac{3[I]-2}{4[I]} + ([I]+2)\frac{m^2}{[I]^3}\right]. \tag{44}$$

Resonance frequencies $\omega_{ij}=(E_i-E_j)/\hbar$ of clock, transitions can be determined. The ground-state energies $E_{fm}$ of the Hamiltonian equation (2) are $$E_{fm} = -\frac{\hbar\omega_{hf}}{2[I]} - \frac{\mu_I}{I}Bm \pm \frac{\hbar\omega_{hf}}{2}\sqrt{1+\frac{4m}{[I]}x+x^2}\ , \tag{45}$$

where $\omega_{hf}=A[I]/2\hbar$ is the zero-field ground-state hyper-fine frequency and $$x = \frac{(g_S\mu_B + \mu_I/I)B}{\hbar\omega_{hf}} \tag{46}$$

is the Breit-Rabi parameter. The ±signs of equation (45) correspond to the sublevels with f=a=I+½ and f=b=I −½, respectively. The resonance frequencies $\omega_{am;bm}$, correct to second order in the magnetic field, are given by $$\omega_{am:bm} = \omega_{hf}\left[1 + \frac{2m}{[I]}x + \frac{1}{2}\left(1 - \frac{4m^2}{[I]^2}\right)x^2\right]. \tag{47}$$

The frequency $\omega_{a0;\ b0}$ of the 0-0 clock transition depends on the magnetic field only in second order and is $$\omega_{a0:b0} = \omega_{hf}\left(1 + \frac{x^2}{2}\right). \tag{48}$$

According to equation (44), the damping rate of this transition is $$\gamma_{a0:b0} = \frac{1}{T_{ex}}\left(\frac{3}{4} - \frac{1}{2[I]}\right). \tag{49}$$

The resonance frequencies $^{\omega}$a, m±1:2: b, m ∓½ of transitions between states (a, $\overline{m}$±½) and (b, $\overline{m}$±½)are $$\omega_{a,m\pm1/2:b,m\mp1/2} = \mp\frac{\mu_I B}{I\hbar} + \omega_{hf}\left[1 + \frac{2\overline{m}}{[I]}x + \frac{1}{2}\left(1 - \frac{4\overline{m}^2+1}{[I]^2}\right)x^2\right]. \tag{50}$$

The frequencies ω+ and ω− of the "end" transitions (a, a)↔(b, b), with $\overline{m}$=I, and (a, −a)↔(b, −b), with $\overline{m}$=−I, are given by $$\omega_+ = \omega_{hf}\left(1 + \frac{2I}{[I]}x + \frac{2I}{[I]^2}x^2\right) - \frac{\mu_I B}{I\hbar},\qquad \omega_- = \omega_{hf}\left(1 - \frac{2I}{[I]}x + \frac{2I}{[I]^2}x^2\right) + \frac{\mu_I B}{I\hbar}. \tag{51}$$

While the frequencies of the "end" transitions are linear in the magnetic field, their average, $$\overline{\omega} = \omega_{hf}\left(1 + \frac{2I}{[I]^2}x^2\right) + O(x^4) \tag{52}$$

is field-independent to first-order, similar to the frequency of the conventional 0-0 transition, and the term quadratic in x is a factor $4I/[I]^2$ smaller compared to the corresponding term for the 0-0 transition. The difference between the frequencies of the "end" transitions, $$\Delta\omega = \omega_+ - \omega_- = \frac{2(2Ig_S\mu_B - \mu_I/I)}{[I]\hbar}B + O(B^3) \tag{53}$$

is proportional to the external magnetic field and can be used to measure or lock the field.

A small magnetic field of amplitude $B_1$, oscillating at the frequency $\omega\approx\omega_{ij}$ and polarized for maximum coupling of the states |i> and |j>, will induce an oscillating electronic spin with the same polarization and with an amplitude $<S>_1 \propto \chi_{ij} B_1$. The relative susceptibility is $$X_{ij} = \frac{(\rho_{ii}^{(0)} - \rho_{jj}^{(0)})|\langle i|S|j\rangle|^2}{T_{ex}[(\omega_{ij} - \omega) - i\gamma_{ij}]}. \quad (54)$$

Figure 2A:
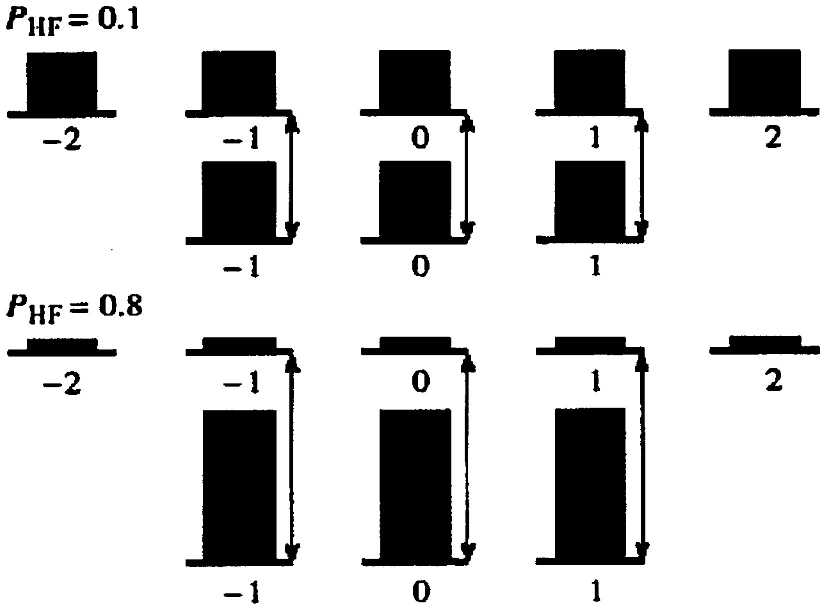
FIG. 2A is a graph of sublevel populations and susceptibilities for an alkali-metal atom having end clock resonances and nuclear spin I=3/2 with non zero electron spin polarization.
Figure 2B:
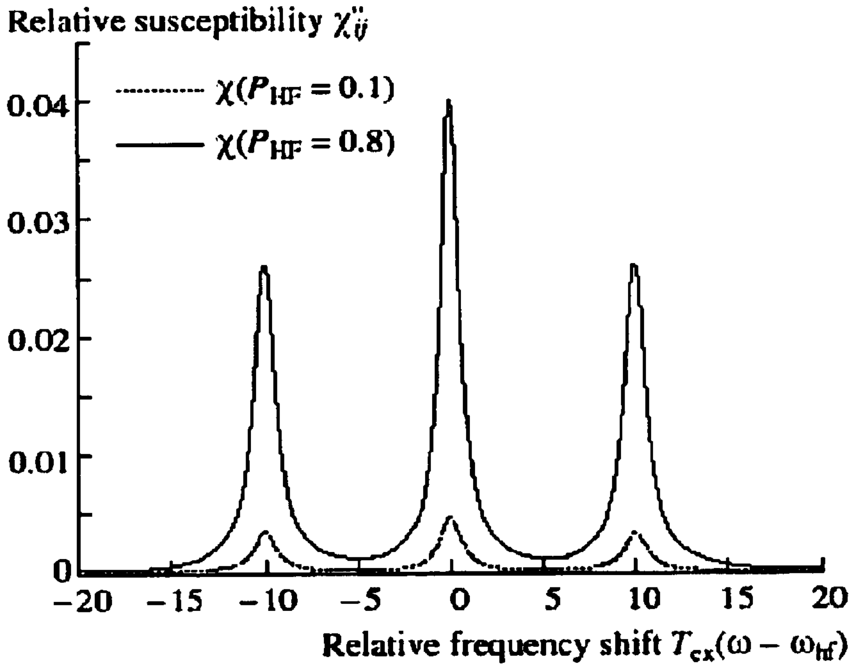
FIG. 2B is a graph of the relative susceptibilities of FIG. 2A as a function of frequency detuning for each polarization.

FIG. 2A illustrates sublevel populations and susceptibilities for an alkali-metal atom of nuclear spin I=3/2 with non-zero electron spin polarization. The two bar-graph diagrams show, for electron spin polarizations P=2<Sz>=0.1 and P=0.8, the populations of the magnetic sub-levels |i> of the Hamiltonian equation (2) for the spin-temperature distribution $p^{(0)}$ of equation (6). The upper five levels have total angular momentum quantum number f=2; the lower three, f=1. Beneath each level the corresponding azimuthal quantum number m is given. FIG. 2B below FIG. 2A shows the imaginary parts $X_{ij}$ of the relative susceptibilities as a function of the frequency detuning $\omega-\omega_{hf}$ for each polarization P. The susceptibility at polarization P=0.1 has been magnified one-hundredfold. The transition to which each resonance corresponds is indicated in the population diagrams by the arrows directly above the resonances. It has been found that as the polarization increases from 0.1 to 0.8, the amplitude of the aa↔bb resonance increases by a factor of 122, while its width decrease by a factor of 5.7.

Accordingly, the end resonance, that is the resonance for the coupled states |i>=|aa> and |j>=|bb>, depends strongly on the polarization of the vapor. The amplitude of the transition increases by a factor 122 as the spin polarization P=2<Sz> increases from 0.1 to 0.8. This is because the population difference $\rho_{ii}-\rho_{jj}$ approaches its maximum value of 1 as P→1.

From FIG. 2A, it is shown that there is a substantial narrowing of the end resonance for high polarizations and spin-exchange broadening vanishes in the limit that P→1. The narrowing occurs because spin-exchange collisions conserve spin angular momentum. The upper state of the end resonance has maximum spin angular momentum. Spin-exchange collisions must couple a (two-atom) initial state to a final state of the same spin angular momentum. In the high polarization limit, there are no final states with the same angular momentum as the initial state, and the scattering is suppressed.

The spin-temperature distributions $\rho^{(0)}$ shown as bar graphs on the top of FIG. 2A and given by equation (6), do not relax at all under the influence of spin-exchange collisions. The spin-temperature distributions of FIG. 2A can therefore be maintained with relatively weak, circularly polarized pumping light which is just enough to compensate for diffusion of the atoms to the cell walls or depolarization due to collisions with buffer-gas atoms such as nitrogen, helium and the like. The weak light causes little light-broadening of the resonance line-widths.

Figure 3A:
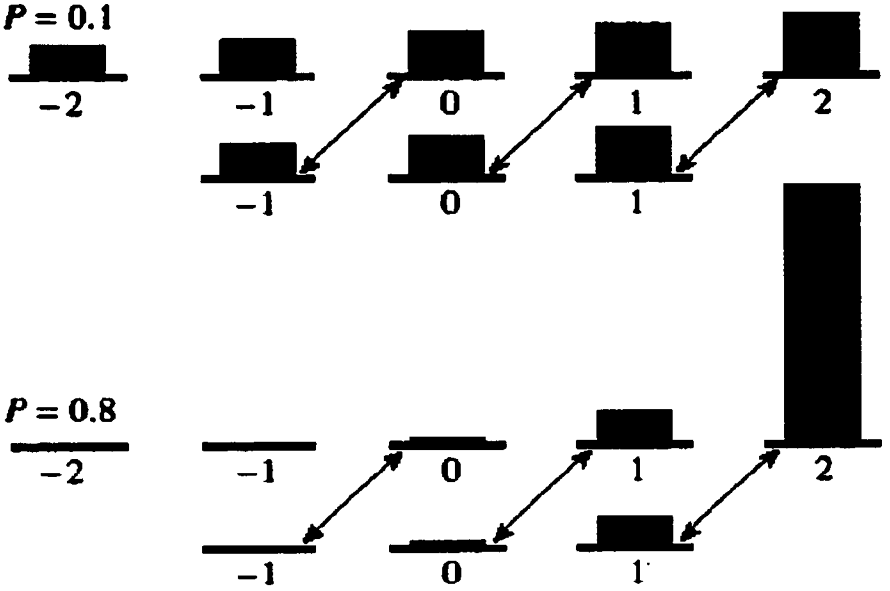
FIG. 3A is a graph of sublevel populations and susceptibilities for an alkali-metal atom having prior art Δm=0 and nuclear spin I=3/2 with non zero electron spin polarization.
Figure 3B:
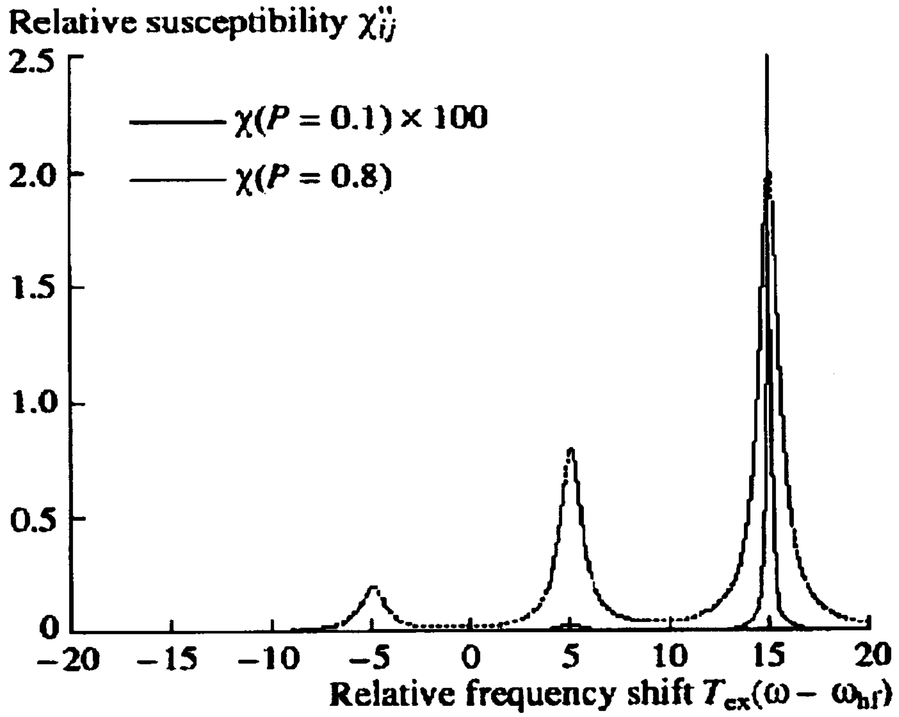
FIG. 3B is a graph of the relative susceptibilities of FIG. 3A as a function of frequency detuning for each polarization.

FIG. 3A illustrates the amplitudes of a prior art clock resonance with Δm=0. Sublevel populations and susceptibilities for an alkali-metal atom of nuclear spin I=3/2 with non-zero hyperfine polarization. The two bar-graph diagrams show, for hyperfine polarizations $P_{HF}$=−2<I·S>/(I+1)=0.1 and $P_{HF}$=0.8, the populations of the magnetic sub-levels |i> of the Hamiltonian equation (2) for the hyperfine-polarized distribution $\rho^{(0)}$ of equation (40). FIG. 3B below FIG. 3A shows the imaginary parts of the relative susceptibilities as a function of the frequency detuning $\omega-\omega_{hf}$ for each of these two hyperfine polarizations. The transition to which each resonance corresponds is indicated in the population diagrams by the arrows directly above the resonances. As the hyperfine polarization increases from 0.1 to 0.8, the amplitude of each am↔bm resonance increases by a factor of 8, but their widths remain constant.

Accordingly, the amplitude of the 0-0 clock resonance increases by a factor of 8 when the magnitude of the hyperfine polarization <I·S> increases by a factor of 8. This is a much smaller increase than for the end transition shown in FIG. 2B, where the amplitude increases by a factor of 122 for an eightfold increase in polarization. The value of the population differences $\rho_{ii}^{(0)}-\rho_{jj}^{(0)}$ for the 0-0 conventional clock transition can not exceed the inverse of the multiplicity [a]=[I]+1 of the upper Zeeman multiplet or [b]=[I]−1 of the lower Zeeman multiplet.

From FIGS. 3A–3B or equation (44), we see that the conventional, 0-0 clock resonance has a line-width that is independent of the hyperfine polarization <I·S>. The line-width is a large fraction, (3[I]−2)/(4[I]) of the spin-exchange rate.

The population distributions $\rho^{(0)}$ of equation (40) shown as bar graphs in FIG. 3A, relax at the spin-exchange rate $1/T_{ex}$. This rate can be much faster than the diffusion rate to the walls or the depolarization rates due to collisions with buffer-gas atoms. To maintain a substantial hyperfine polarization, the optical pumping rate must be comparable to or greater than the spin-exchange rate. The resonance lines will therefore have substantial light broadening, and it will be increasingly difficult to maintain high polarizations at the high vapor densities needed for very small atomic clocks.

To produce a substantial hyperfine polarization <I·S> which is needed for the conventional 0-0 clock transition, the pressure broadening of the absorption lines must not exceed the hyperfine splitting of the optical absorption lines, since the pumping depends on differential absorption from the ground state multiplets of total spin angular momentum a and b. Accordingly, high buffer-gas pressures seriously degrade the optical pumping efficiency for conventional clocks. In contrast, high buffer-gas pressures do not degrade the optical pumping efficiency of an atomic clock, based on left and right end transitions of the present invention which can be generated by pumping with left-and right-circularly polarized $D_1$ light.

Figure 4A:
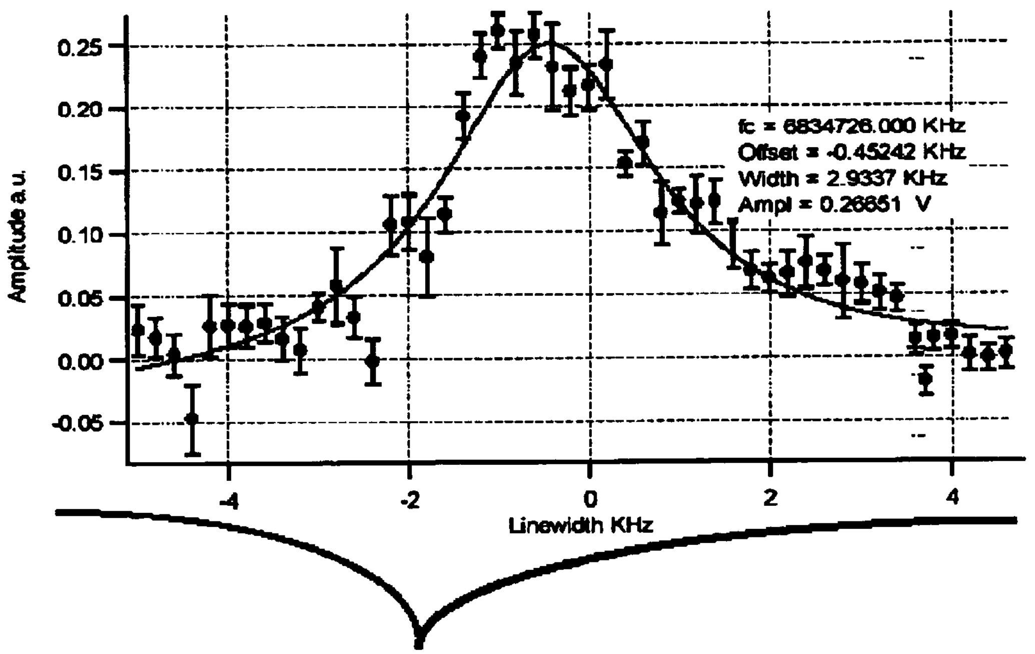
FIG. 4A is a graph of the amplitude of a prior art resonance signal for a prior art 0-0 transition of $^{87}$Rb versus line-widths.
Figure 4B:
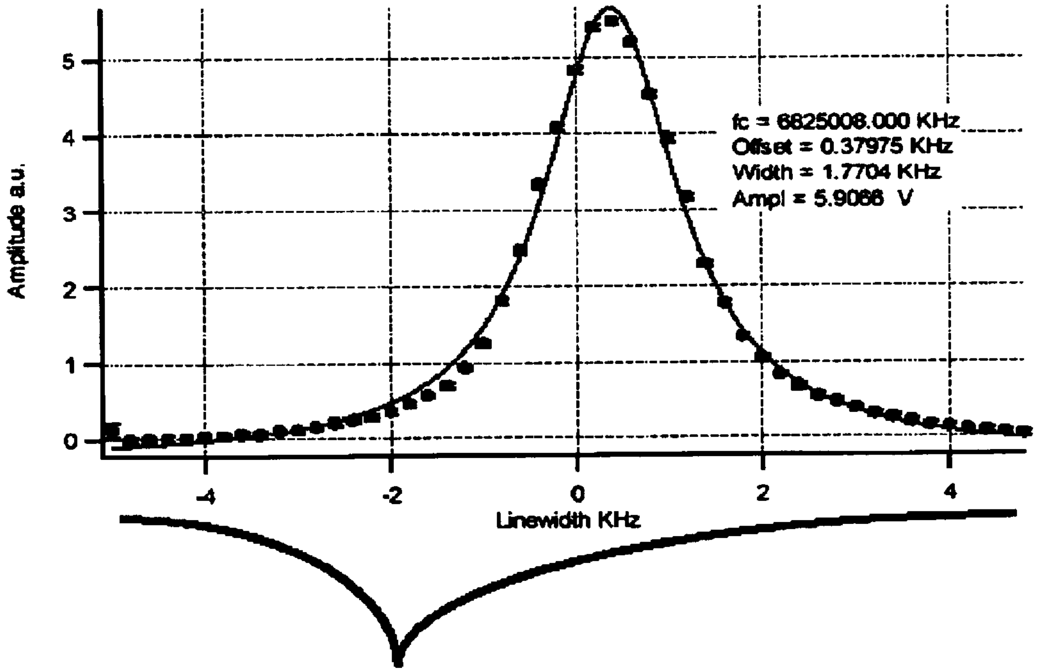
FIG. 4B is a graph of the prior art amplitude of resonance signal for a 1-2 transition of $^{87}$Rb versus line-widths.

FIGS. 4A–4B illustrate the resonance signal for a respective 0-0 transition and an end 1-2 transition of $^{87}$Rb. FIG. 4A illustrates that the resonance signal for a prior art 0-0 hyperfine transition of $^{87}$Rb has line broadening. FIG. 4B illustrates that the resonance signal for the 1-2 hyperfine end transition of $^{87}$Rb has light narrowing and an increased signal to noise ratio. The results were determined from cell T108 ($N_2$700 torr+$^{87}$Rb) at 140° C., thickness 2 mm, laser frequency 377104 GHz, beam diameter 6 mm, microwave fc=6.8253815 GHz −5 dbm, B field~4.6 Gauss, 1-2 transition.

Figure 5:
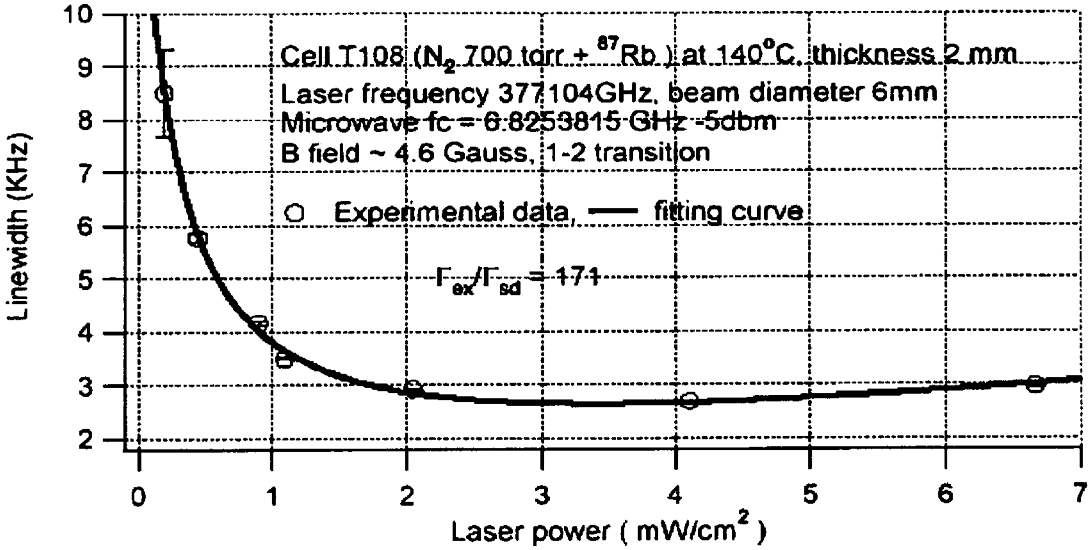
FIG. 5 is a graph of the line-width for the 1-2 hyperfine transition of $^{87}$Rb versus an increase in laser power.

FIG. 5 illustrates a graph of the line-width for the 1-2 hyperfine transition of $^{87}$Rb versus an increase in laser power. It is shown that higher intensity of circularly polarized laser light polarizes Rb vapor inside the cell and narrows the line-width of hyperfine end transitions for the 1-2 hyperfine transition.

Figure 6:
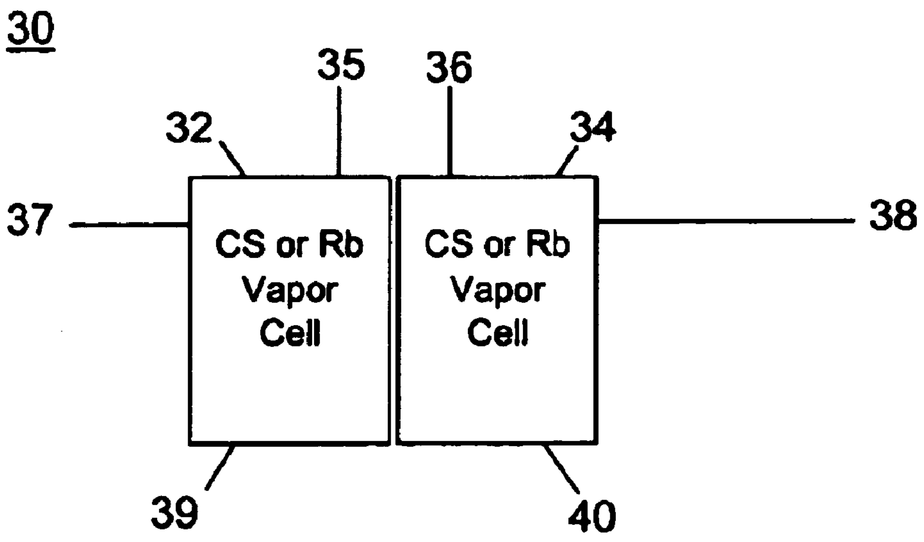
FIG. 6 is a schematic diagram of a system of operating an atomic clock in accordance with the teachings of the present invention.

FIG. 6 is a schematic diagram of a system for operating an atomic clock 30. Vapor cell 32 contains atoms of material which have a hyperfine resonance transition that occurs between a left end resonance. Vapor cell 34 contains atoms of a material which have a hyperfine resonance transition that occurs between a right end resonance. Suitable materials include cesium or rubidium. Conventional means can be used with cell 32 and cell 34 for stabilizing the magnetic B field and temperature. Vapor cells 32 and 34 can include buffer gases inside the cells to suppress frequency shift due to temperature drift.

Laser diode 35 generates a beam of left circularly polarized light which pumps atomic vapor in cell 32 to maximize the left end resonance. Laser diode 36 generates a beam of right circularly polarized light which pumps atomic vapor in cell 34 to maximize the right end resonance. Laser diode 35, 36 can also be used to generate light modulated at a Bohr frequency of the end resonances.

Control signal designed to cause a change in state of the atoms in cell 32 is applied as to input 37. Control signal designed to cause a change in state of the atoms in cell 34 is applied as input 38. Control signals can be generated by a frequency oscillator and hyperfine resonance lock loop. Alternatively, control signals can be generated by applying a magnetic field oscillating at a Bohr frequency of the end resonances and pumping the atoms with circularly polarized $D_1$ resonance light. Photo detectors 39 and 40 detect radiation from respective cells 32 and 34.

A similar system described above for operating an atomic clock can be used for operating a magnetometer.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed is:

1. A method for operating an atomic clock comprising the steps of:

generating atoms in a ground-state sublevel of maximum or minimum spin from which end resonances can be excited; and exciting magnetic resonance transitions in the atoms with magnetic fields oscillating at Bohr frequencies of the end resonances wherein the atoms are pumped with circularly polarized $D_1$ resonance light.

2. The method of claim 1 wherein the magnetic field oscillates at the Bohr frequency ω− of the resonance.

3. The method of claim 1 wherein the magnetic field oscillates at the Bohr frequency ω+ of the resonance.

4. The method of claim 1 wherein said atoms are rubidium atoms or cesium atoms.

5. A method for operating an atomic clock comprising the steps of:

generating atoms in a ground-state sublevel of maximum or minimum spin; and pumping the atoms with light modulated at a Bohr frequency of the end resonance for exciting transitions in the atoms wherein the atoms are pumped with circularly polarized $D_1$ resonance light.

6. The method of claim 5 wherein the light is modulated at the Bohr frequency ω− of the resonance.

7. The method of claim 5 wherein the light is modulated at the Bohr frequency ω+ of the resonance.

8. The method of claim 5 wherein said atoms are rubidium atoms or cesium atoms.

9. A system for operating an atomic clock comprising:

means for generating atoms in a ground-state sublevel of maximum or minimum spin from which end resonances can be excited; and means for generating hyperfine transitions of said atoms by applying magnetic fields oscillating at Bohr frequencies of the end resonances and pumping the atoms with circularly polarized $D_1$ resonance light.

10. The system of claim 9 wherein the magnetic field oscillates at the Bohr frequency ω− of the resonance.

11. The system of claim 9 wherein the magnetic field oscillates at the Bohr frequency ω+ of the resonance.

12. The system of claim 9 wherein said atoms are rubidium atoms or cesium atoms.

13. A system for operating an atomic clock comprising:

means for generating atoms in a ground-state sublevel of maximum or minimum spin, from which end resonances can be excited; and means for pumping the atoms with light modulated at a Bohr frequency of the end resonance for exciting transitions in the atoms wherein the atoms are pumped with circularly polarized $D_1$ resonance light.

14. The system of claim 13 wherein the light is modulated at the Bohr frequency ω− of the resonance.

15. The system of claim 13 wherein the light is modulated at the Bohr frequency ω+ of the resonance.

16. The system of claim 10 wherein said atoms are rubidium atoms or cesium atoms.

17. A method for operating a magnetometer comprising the steps of:

generating atoms in a ground-state sublevel of maximum or minimum spin from which end resonances can be excited; and exciting magnetic resonance transitions in the atoms with magnetic fields oscillating at Bohr frequencies of the end resonances and pumping the atoms with circularly polarized $D_1$ resonance light.

18. The method of claim 17 wherein the magnetic field oscillates at the Bohr frequency ω− of the resonance.

19. The method of claim 17 wherein the magnetic field oscillates at the Bohr frequency ω+ of the resonance.

20. The method of claim 17 wherein said atoms are rubidium atoms or cesium atoms.

21. A method for operating a magnetometer comprising the steps of:

generating atoms in a ground-state sublevel of maximum or minimum spin; and pumping the atoms with light modulated at a Bohr frequency of the end resonance for exciting transitions in the atoms wherein the atoms are pumped with circularly polarized $D_1$ resonance light.

22. The method of claim 21 wherein the light is modulated at the Bohr frequency ω− of the resonance.

23. The method of claim 21 wherein the light is modulated at the Bohr frequency ω+ of the resonance.

24. The method of claim 21 wherein said atoms are rubidium atoms or cesium atoms.

25. A system for operating a magnetometer comprising:

means for generating atoms in a ground-state sublevel of maximum or minimum spin from which end resonances can be excited; and means for generating hyperfine transitions of said atoms by applying magnetic fields oscillating at Bohr frequencies of the end resonances and pumping the atoms with circularly polarized $D_1$ resonance light.

26. The system of claim 25 wherein the magnetic field oscillates at the Bohr frequency ω− of the resonance.

27. The system of claim 25 wherein the magnetic field oscillates at the Bohr frequency ω+ of the resonance.

28. The system of claim 25 wherein said atoms are rubidium atoms or cesium atoms.

29. A system for operating a magnetometer comprising:

means for generating atoms in a ground-state sublevel of maximum or minimum spin, from which end resonances can be excited; and means for pumping the atoms with light modulated at a Bohr frequency of the end resonance for exciting transitions in the atoms wherein the atoms are pumped with circularly polarized $D_1$ resonance.

30. The system of claim 29 wherein the light is modulated at the Bohr frequency ω− of the resonance.

31. The system of claim 29 wherein the light is modulated at the Bohr frequency ω+ of the resonance.

32. The system of claim 29 wherein said atoms are rubidium atoms or cesium atoms.

* * * * *